United States Patent
Chan et al.

(10) Patent No.: US 8,823,128 B2
(45) Date of Patent: Sep. 2, 2014

(54) SEMICONDUCTOR STRUCTURE AND CIRCUIT WITH EMBEDDED SCHOTTKY DIODE

(75) Inventors: Wing-Chor Chan, Hsinchu (TW); Hsin-Liang Chen, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 684 days.

(21) Appl. No.: 13/107,405

(22) Filed: May 13, 2011

(65) Prior Publication Data

US 2012/0286362 A1    Nov. 15, 2012

(51) Int. Cl.
*H01L 27/06* (2006.01)
*H01L 21/8249* (2006.01)

(52) U.S. Cl.
CPC ........ *H01L 21/8249* (2013.01); *H01L 27/0664* (2013.01); *H01L 27/0635* (2013.01)
USPC ........... 257/477; 257/476; 257/478; 257/479; 257/484; 257/355; 257/E27.015

(58) Field of Classification Search
USPC ................. 257/476, 477, 478, 479, 484, 355, 257/E27.015
See application file for complete search history.

(56) References Cited

U.S. PATENT DOCUMENTS

| 5,079,182 A * | 1/1992 | Ilderem et al. ............... 438/233 |
| 7,405,445 B2 | 7/2008 | Huang et al. |
| 2003/0038298 A1* | 2/2003 | Cheng et al. ................. 257/107 |
| 2009/0236679 A1* | 9/2009 | Chiang et al. ................ 257/483 |

* cited by examiner

*Primary Examiner* — Michael Jung
*Assistant Examiner* — John P Dulka
(74) *Attorney, Agent, or Firm* — McClure, Qualey & Rodack, LLP

(57) ABSTRACT

A semiconductor structure is proposed. A third well is formed between a first well and a second well. A first doped region and a second doped region are formed in a surface of the third well. A third doped region is formed between the first doped region and the second doped region. A fourth doped region is formed in a surface of the first well. A fifth doped region is formed in a surface of the second well. A first base region and a second base region are respectively formed in surfaces of the first well and the second well. A first Schottky barrier is overlaid on a part of the first base region and the first doped region. A second Schottky barrier is overlaid on a part of the second base region and the second doped region.

12 Claims, 3 Drawing Sheets

SEMICONDUCTOR STRUCTURE AND CIRCUIT WITH EMBEDDED SCHOTTKY DIODE

BACKGROUND

1. Technical Field

The invention relates in general to a semiconductor structure and a semiconductor circuit.

2. Background

The BICMOS-DMOS (BCD) process has been widely used in modern smart power applications. Smart Power ICs usually use Lateral Diffusion MOS transistors (LDMOS) for switching because of the characteristic of low on-state resistance of the LDMOS. Due to the characteristic of low on-state resistance, the LDMOS device has electrostatic discharge (ESD) currents occurred mainly in the surface or the drain edge during an ESD event of the LDMOS device. Consequently, the surface junction region of the LDMOS device will be destructed due to high currents and high electric field. The ESD protection performance of the LDMOS device usually depends on the total width and the surface or the lateral rules thereof. However, the surface or the lateral rules can't be increased to improve the ESD protection performance based on electrical requirements of the low on-state resistance. Therefore, how to design an ESD protection structure with better performance has become a main issue currently.

SUMMARY

The disclosure is directed to a semiconductor structure and a semiconductor circuit, for protecting Lateral Diffusion MOS transistors (LDMOS) by embedded Schottky diodes in electrostatic discharge (ESD) Bipolar Junction transistor (BJT) device in the BICOMS-DMOS (BCD) process.

According to a first aspect of the present disclosure, a semiconductor structure is provided. The semiconductor structure includes a first well, a second well, a third well, a first doped region, a second doped region, a third doped region, a fourth doped region, a fifth doped region, a first base region, a second base region, a first Schottky barrier and a second Schottky barrier. The second well is separated from the first well. The third well is formed between the first well and the second well. The first doped region is formed in a surface of the third well. The second doped region is formed in the surface of the third well. The third doped region is formed between the first doped region and the second doped region, and separated from the first doped region and the second doped region. The third doped region is electrically connected to the first doped region and the second doped region. The fourth doped region is formed in a surface of the first well. The fifth doped region is formed in a surface of the second well and electrically connected to the fourth doped region. The first base region is formed in the surface of the first well and separated from the fourth doped region. The second base region is formed in the surface of the second well and separated from the fifth doped region. The first Schottky barrier is formed and overlaid on a part of the first base region and a part of the first doped region. The second Schottky barrier is formed and overlaid on a part of the second base region and a part of the second doped region. The first well, the second well, the third doped region, the fourth doped region and the fifth doped region have a first conductivity type, and the third well, the first doped region, the second doped region, the first base region and the second base region have a second conductivity type opposite to the first conductivity type.

According to a second aspect of the present disclosure, a semiconductor circuit is provided. The semiconductor circuit includes a control circuit, an output stage circuit and a protection circuit. The output stage circuit has an output node and is electrically connected to the control circuit. The output stage circuit includes a first Lateral Diffusion MOS transistor (LDMOS) and a second LDMOS. The first LDMOS has a first terminal receiving a working voltage, a second terminal coupled to the output node, and a control terminal controlled by the control circuit. The second LDMOS has a first terminal coupled to the output node, a second terminal receiving a ground voltage, and a control terminal controlled by the control circuit. The protection circuit includes a first Bipolar Junction Transistor (BJT), a second BJT, a first Schottky diode and a second Schottky diode. The first BJT has a base and an emitter coupled to the output node, and a collector receiving the working voltage. The second BJT has a collector coupled to the output node, and a base and an emitter receiving the ground voltage. The first Schottky diode has an anode coupled to the emitter of the first BJT, and a cathode coupled to the collector of the first BJT. The second Schottky diode has an anode coupled to the emitter of the second BJT, and a cathode coupled to the collector of the second BJT.

According to a third aspect of the present disclosure, a semiconductor circuit is provided. The semiconductor circuit includes a control circuit, an output stage circuit and a protection circuit. The output stage circuit has an output node and is electrically connected to the control circuit. The output stage circuit includes a first Double Diffusion MOS transistor (DMOS) and a second DMOS. The first DMOS has a first terminal receiving a working voltage, a second terminal coupled to the output node, and a control terminal controlled by the control circuit. The second DMOS has a first terminal coupled to the output node, a second terminal receiving a ground voltage, and a control terminal controlled by the control circuit. The protection circuit includes a first Bipolar Junction Transistor (BJT), a second BJT, a first Schottky diode and a second Schottky diode. The first BJT has a base and an emitter coupled to the output node, and a collector receiving the working voltage. The second BJT has a collector coupled to the output node, and a base and an emitter receiving the ground voltage. The first Schottky diode has an anode coupled to the emitter of the first BJT, and a cathode coupled to the collector of the first BJT. The second Schottky diode has an anode coupled to the emitter of the second BJT, and a cathode coupled to the collector of the second BJT.

The invention will become apparent from the following detailed description of the preferred but non-limiting embodiments. The following description is made with reference to the accompanying drawings.

DETAILED DESCRIPTION OF THE INVENTION

The disclosure proposes a semiconductor structure and a semiconductor circuit, utilizing embedded Schottky diodes in electrostatic discharge (ESD) Bipolar Junction transistor (BJT) device in a BICOMS-DMOS (BCD) process to reduce reverse recovery time of Lateral Diffusion MOS transistors (LDMOS) or Double Diffusion MOS transistor (DMOS), thus capable of protecting the LDMOS or DMOS during ESD events.

Figure 1:
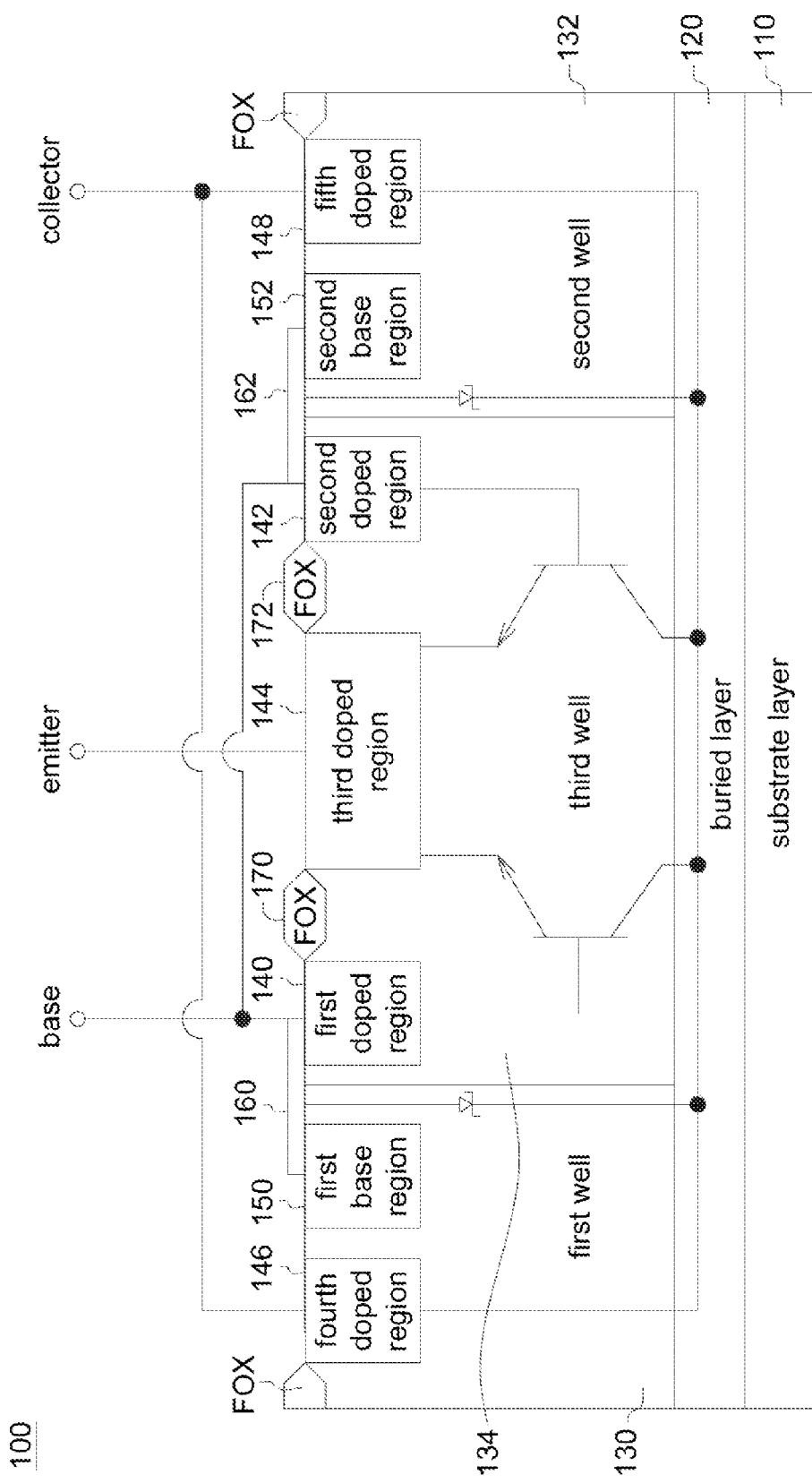
FIG. 1 shows a schematic illustration illustrating a semiconductor structure according to an embodiment.

Referring to FIG. 1, a schematic illustration illustrating a semiconductor structure according to an embodiment is shown. The semiconductor structure 100 shown in FIG. 1 can be fabricated by the standard BCD process, and applied to a local oxidation of silicon (LOCOS) process and a shallow trench isolation (STI) process, a DTI (deep trench isolation) process, a SOI process, an N(P)-EPI and non-EPI process. The semiconductor structure 100 includes a substrate layer 110, an buried layer 120, a first well 130, a second well 132, a third well 134, a first doped region 140, a second doped region 142, a third doped region 144, a fourth doped region 146, a fifth doped region 148, a first base region 150, a second base region 152, a first Schottky barrier 160, a second Schottky barrier 162, a first isolation region 170 and a second isolation region 172.

In FIG. 1, the buried layer 120, the first well 130, the second well 132, the third doped region 144, the fourth doped region 146 and the fifth doped region 148 have a first conductivity type; the substrate layer 110, the third well 134, the first doped region 140, the second doped region 142, the first base region 150 and the second base region 152 have a second conductivity type opposite to the first conductivity type. The first conductivity type is, for example, N type, and the second conductivity type is, for example, P type, but it is not limited thereto and is designed according to requirements.

The buried layer 120 is formed on the substrate layer 110. The first well 130 is formed on the buried layer 120. The second well 132 is formed on the buried layer 120 and separated from the first well 130. The third well 134 is formed between the first well 130 and the second well 132. The first doped region 140 is formed in a surface of the third well 134. The second doped region 142 is formed in the surface of the third well 134. The third doped region 144 is formed between the first doped region 140 and the second doped region 142, and separated from the first doped region 140 and the second doped region 142. As shown in FIG. 1, the third doped region 144 is electrically connected to the first doped region 140 and the second doped region 142.

The fourth doped region 146 is formed in a surface of the first well 130. The fifth doped region 148 is formed in a surface of the second well 132 and electrically connected to the fourth doped region 146 as shown in FIG. 1. As indicated in FIG. 1, the third doped region 144, the first doped region 140 and the fourth doped region 146 form a first BJT by working respectively as an emitter, a base and a collector of the first BJT. Similarly, as indicated in FIG. 1, the third doped region 144, the second doped region 142 and the fifth doped region 148 form a second BJT by working respectively as an emitter, a base and a collector of the second BJT.

The first base region 150 is formed in the surface of the first well 130 and separated from the fourth doped region 146. The second base region 152 is formed in the surface of the second well 132 and separated from the fifth doped region 148. The first base region 150 and the second base region 152 can be formed by second/first conductivity type. The first Schottky barrier 160 is formed and overlaid on a part of the first base region 150 and a part of the first doped region 140. The second Schottky barrier 162 is formed and overlaid on a part of the second base region 152 and a part of the second doped region 142. The first Schottky barrier 160 and the second Schottky barrier 162 can be formed by using TiSi, CoSi, PtSi or ErSi, and it is not limited thereto. As indicated in FIG. 1, two Schottky diodes are formed and respectively connected in parallel with the first BJT and the second BJT.

The first isolation region 170 is overlaid on a part of the third well 134, and separates the first doped region 140 from the third doped region 144. The second isolation region 172 is overlaid on a part of the third well 134, and separates the second doped region 142 from the third doped region 144. Wherein the first isolation region 170 and the second isolation region 172 include, for example, Field Oxide layers (FOX).

Figure 2:
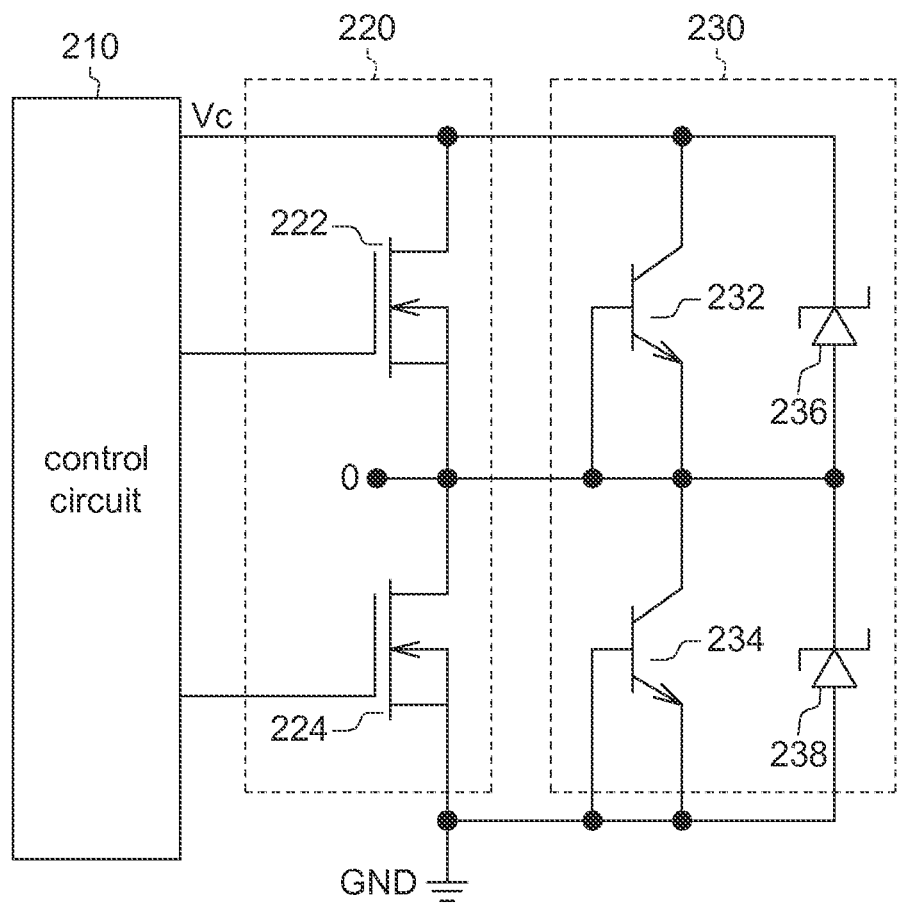
FIG. 2 shows a schematic illustration illustrating a semiconductor circuit according to an embodiment.

Referring to FIG. 2, a schematic illustration illustrating a semiconductor circuit according to an embodiment is shown. The semiconductor circuit 200 includes a control circuit 210, an output stage circuit 220 and a protection circuit 230. The output stage circuit 220 has an output node O and is electrically connected to the control circuit 210. The output stage circuit 220 includes a first LDMOS/DMOS 222 and a second LDMOS/DMOS 224. The first LDMOS/DMOS 222 is a high side LDMOS/DMOS and has a first terminal for receiving a working voltage Vc, a second terminal coupled to the output node O, and a control terminal controlled by the control circuit 210. The second LDMOS/DMOS 224 is a low side LDMOS/DMOS and has a first terminal coupled to the output node O, a second terminal for receiving a ground voltage GND, and a control terminal controlled by the control circuit 210.

The protection circuit 230 includes a first BJT 232, a second BJT 234, a first Schottky diode 236 and a second Schottky diode 238. The first BJT 232 has a base and an emitter coupled to the output node O, and a collector receiving the working voltage Vc. The second BJT 234 has a collector coupled to the output node O, and a base and an emitter receiving the ground voltage GND. The first Schottky diode 236 has an anode coupled to the emitter of the first BJT 232, and a cathode coupled to the collector of the first BJT 232. The second Schottky diode 238 has an anode coupled to the emitter of the second BJT 234, and a cathode coupled to the collector of the second BJT 234.

The structure of the protection circuit 230 in FIG. 2 is substantially the same as the semiconductor structure 100 shown in FIG. 1. Consequently, it does not need to increase any layer in the standard BCD process to form the semiconductor structure 100 of the protection circuit 230. Making use of the NPN BJT characteristics of the first BJT 232 and the second BJT 234, the ESD current generated by the output stage circuit 220 as the ESD events occurred could be lead fast. In output stage circuit 220 of the semiconductor circuit 220, the low side second LDMOS/DMOS 224 have to reduce the reverse recovery time to lower the switching power loss due to the synchronous conversion using two LDMOS/DMOS. Because of the first Schottky barrier 160 and the second Schottky barrier 162, the embedded Schottky diodes can reduce the leakage currents as the devices are reverse biased, hence reducing the switching power loss of the low side second LDMOS/DMOS 224.

Figure 3:
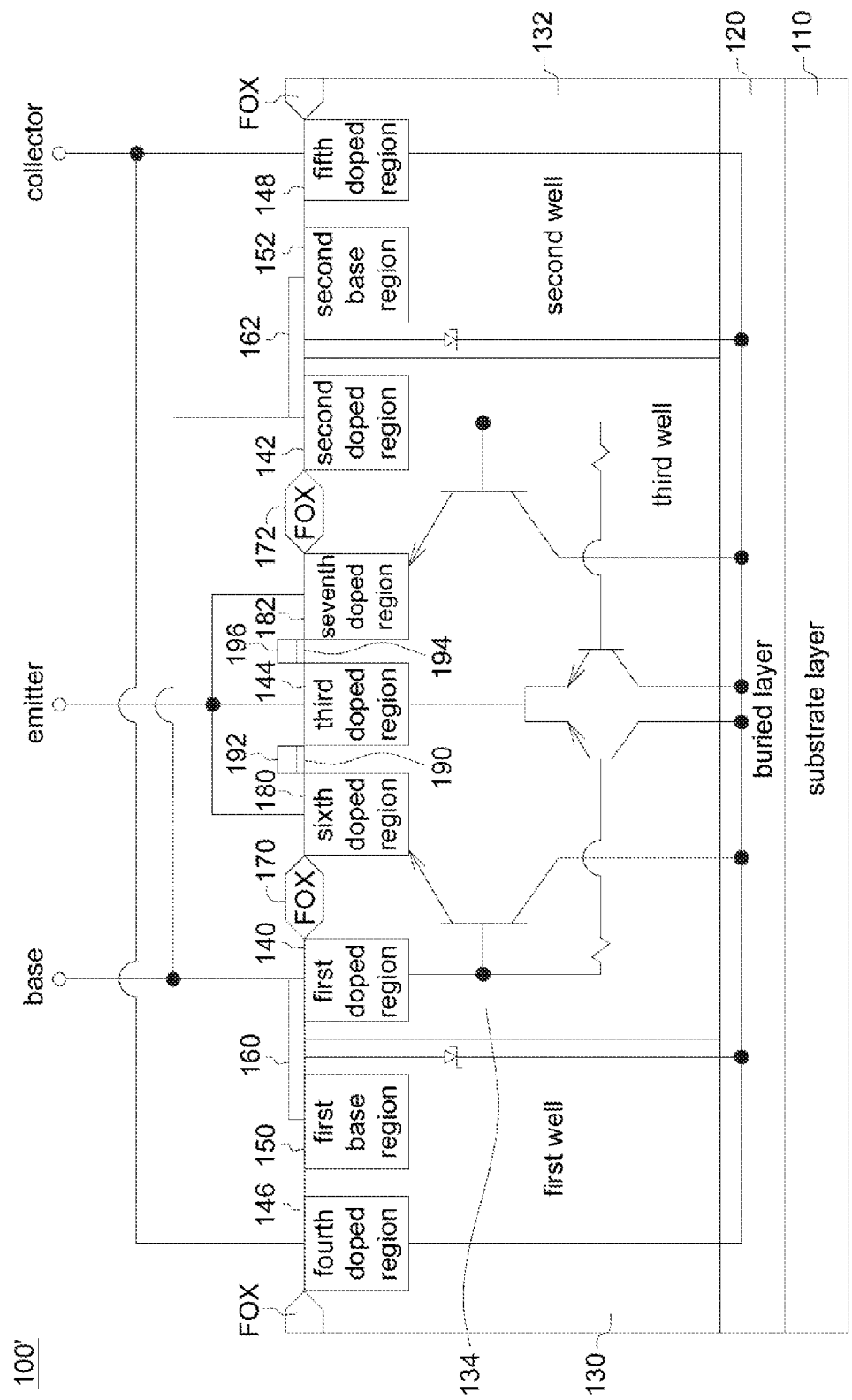
FIG. 3 shows a schematic illustration illustrating a semiconductor structure according to another embodiment.

In addition, it can form multiple parallel BJTs in the semiconductor structure 100 to enhance the ESD protection ability. Referring to FIG. 3, a schematic illustration illustrating a semiconductor structure according to another embodiment is shown. Compared with the semiconductor structure 100, the semiconductor structure 100' further includes a sixth doped region 180, a seventh doped region 182, a first gate oxide layer 190, a first poly region 192, a second gate oxide layer 194 and a second poly region 196. The sixth doped region 180 and the seventh doped region 182 have the first conductivity type. The sixth doped region 180 is formed in the surface of the third well 134 and separated from the third doped region 144. The first gate oxide layer 190 is formed on the surface of the third well 134 and locates neighboring on the third doped region 144 and the sixth doped region 180. The first poly region 192 is formed on the first gate oxide layer 190. The seventh doped region 182 is formed in the surface of the third well 134 and separated from the third doped region 144 and the sixth doped region 180. The sixth doped region 180 and the seventh doped region 182 are electrically connected to the third doped region 144. The second gate oxide layer 194 is formed on the surface of the third well 134 and locates neighboring on the third doped region 144 and the seventh doped region 182. The second poly region 196 is formed on the second gate oxide layer 194.

The semiconductor structure and semiconductor circuit proposed in the above disclosure embeds the Schottky diodes in the ESD BJT device in the BCD process, and are capable of improving the turned-on speed of the ESD BJT device as the ESD events occurred and lowering the reverse recovery time of the LDMOS/DMOS, thus efficiently reducing the risks of the protected devices and possibilities of internal circuit damage. Therefore, the ESD protection can be achieved during the ESD events before the high voltage device is turned on.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:
   a first well;
   a second well, separated from the first well;
   a third well, formed between the first well and the second well;
   a first doped region, formed in a surface of the third well;
   a second doped region, formed in the surface of the third well;
   a third doped region, formed between the first doped region and the second doped region, and separated from the first doped region and the second doped region, the third doped region electrically connected to the first doped region and the second doped region;
   a fourth doped region, formed in a surface of the first well;
   a fifth doped region, formed in a surface of the second well and electrically connected to the fourth doped region;
   a first base region, formed in the surface of the first well and separated from the fourth doped region;
   a second base region, formed in the surface of the second well and separated from the fifth doped region;
   a first Schottky barrier, formed and overlaid on a part of the first base region and a part of the first doped region; and
   a second Schottky barrier, formed and overlaid on a part of the second base region and a part of the second doped region;
   wherein the first well, the second well, the third doped region, the fourth doped region and the fifth doped region have a first conductivity type, and the third well, the first doped region, the second doped region, the first base region and the second base region have a second conductivity type opposite to the first conductivity type.

2. The semiconductor structure according to claim 1, wherein the first conductivity type is N type, and the second conductivity type is P type.

3. The semiconductor structure according to claim 1, further comprising:
   a substrate layer, having the second conductivity type; and
   a buried layer, having the first conductivity type and formed on the substrate layer;
   wherein the first well, the second well and the third well are formed on the buried layer.

4. The semiconductor structure according to claim 1, wherein the third doped region, the first doped region and the fourth doped region form a first Bipolar Junction Transistor (BJT) by working respectively as an emitter, a base and a collector of the first BJT, and the third doped region, the second doped region and the fifth doped region form a second BJT by working respectively as an emitter, a base and a collector of the second BJT.

5. The semiconductor structure according to claim 1, wherein the first BJT and the second BJT are electrically connected in parallel.

6. The semiconductor structure according to claim 1, further comprising:
   a sixth doped region, formed in the surface of the third well and separated from the third doped region;
   a first gate oxide layer, formed on the surface of the third well and neighboring on the third doped region and the sixth doped region;
   a first poly region, formed on the first gate oxide layer;
   a seventh doped region, formed in the surface of the third well and separated from the third doped region and the sixth doped region, the sixth doped region and the seventh doped region electrically connected to the third doped region;
   a second gate oxide layer, formed on the surface of the third well and neighboring on the third doped region and the seventh doped region; and
   a second poly region, formed on the second gate oxide layer;
   wherein the sixth doped region and the seventh doped region have the first conductivity type.

7. The semiconductor structure according to claim 1, further comprising:
   a first isolation region, overlaid on a part of the third well, and for separating the first doped region from the third doped region; and
   a second isolation region, overlaid on a part of the third well, and for separating the second doped region from the third doped region.

8. The semiconductor structure according to claim 7, wherein the first isolation region and the second isolation region comprise Field Oxide layers.

9. A semiconductor circuit, comprising:
   a control circuit;
   an output stage circuit, having an output node and electrically connected to the control circuit, the output stage circuit comprising:
   a first Lateral Diffusion MOS transistor (LDMOS), having a first terminal receiving a working voltage, a second terminal coupled to the output node, and a control terminal controlled by the control circuit; and
   a second LDMOS, having a first terminal coupled to the output node, a second terminal receiving a ground voltage, and a control terminal controlled by the control circuit; and
   a protection circuit, comprising:
   a first Bipolar Junction Transistor (BJT), having a base and an emitter coupled to the output node, and a collector receiving the working voltage;
   a second BJT, having a collector coupled to the output node, and a base and an emitter receiving the ground voltage;
   a first Schottky diode, having an anode coupled to the emitter of the first BJT, and a cathode coupled to the collector of the first BJT; and a second Schottky diode, having an anode coupled to the emitter of the second BJT, and a cathode coupled to the collector of the second BJT.

10. The semiconductor circuit according to claim 9, wherein the protection circuit further comprises:
a third BJT, having a base and an emitter coupled to the output node, and a collector receiving the working voltage;
a fourth BJT, having a collector coupled to the output node, and a base and an emitter receiving the ground voltage.

11. A semiconductor circuit, comprising:
a control circuit;
an output stage circuit, having an output node and electrically connected to the control circuit, the output stage circuit comprising:
a first Double Diffusion MOS transistor (DMOS), having a first terminal receiving a working voltage, a second terminal coupled to the output node, and a control terminal controlled by the control circuit; and
a second DMOS, having a first terminal coupled to the output node, a second terminal receiving a ground voltage, and a control terminal controlled by the control circuit; and a protection circuit, comprising:
a first Bipolar Junction Transistor (BJT), having a base and an emitter coupled to the output node, and a collector receiving the working voltage;
a second BJT, having a collector coupled to the output node, and a base and an emitter receiving the ground voltage;
a first Schottky diode, having an anode coupled to the emitter of the first BJT, and a cathode coupled to the collector of the first BJT; and
a second Schottky diode, having an anode coupled to the emitter of the second BJT, and a cathode coupled to the collector of the second BJT.

12. The semiconductor circuit according to claim 11, wherein the protection circuit further comprises:
a third BJT, having a base and an emitter coupled to the output node, and a collector receiving the working voltage;
a fourth BJT, having a collector coupled to the output node, and a base and an emitter receiving the ground voltage.

* * * * *